United States Patent [19]

Ohmi

[11] Patent Number: 5,208,171
[45] Date of Patent: May 4, 1993

[54] PROCESS FOR PREPARING BICMOS SEMICONDUCTOR DEVICE

[75] Inventor: Toshinori Ohmi, Higashiosaka, Japan
[73] Assignee: Sharp Kabushiki Kaisha, Osaka, Japan
[21] Appl. No.: 786,742
[22] Filed: Nov. 1, 1991
[30] Foreign Application Priority Data

Jan. 22, 1991 [JP] Japan .................. 3-22982

[51] Int. Cl.[5] .......................... H01L 21/265
[52] U.S. Cl. ........................ 437/34; 437/31; 437/45; 437/57
[58] Field of Search .............. 437/34, 31, 57, 32, 437/45

[56] References Cited

U.S. PATENT DOCUMENTS

| | | | |
|---|---|---|---|
| 4,752,589 | 6/1988 | Schaber | 437/34 |
| 4,806,499 | 2/1989 | Shinohara | 437/34 |
| 4,879,255 | 11/1989 | Deguchi et al. | 437/34 |
| 4,962,052 | 10/1990 | Asayama et al. | 437/34 |
| 4,971,921 | 11/1990 | Fukunaga et al. | 437/31 |

Primary Examiner—Brian E. Hearn
Assistant Examiner—Kevin M. Picardat
Attorney, Agent, or Firm—Nixon & Vanderhye

[57] ABSTRACT

A process for preparing a BiCMOS semiconductor device having a MOS transistor element and a bipolar transistor element both of which are constituted in an epitaxial layer of n-type conductivity formed on a substrate of p-type conductivity, which comprises applying, after the formation of said epitaxial layer, an impurity ion of high energy simultaneously to specific of said epitaxial layer under which a channel region of said MOS transistor element and an emitter region of said bipolar transistor element are to be formed, thereby forming highly doped impurity regions around the bottom of said channel region and around the bottom of a base region of said bipolar transistor element.

2 Claims, 6 Drawing Sheets

PROCESS FOR PREPARING BICMOS SEMICONDUCTOR DEVICE

BACKGROUND OF THE INVENTION

1. Field of the Invention

The invention relates to a process for preparing a semiconductor device, and more particularly to a process for preparing a BiCMOS semiconductor device having a MOS transistor element and a bipolar transistor element each on a substrate which can exhibit low power consumption and high speed controllability.

2. Description of the Related Art

A BiCMOS semiconductor device having a p-type region and a n-type region in a substrate of p-type conductivity, the former region including a n-channel MOS transistor or a pnp transistor and the latter region including a p-channel MOS transistor or a npn transistor, has been known.

The BiCMOS semiconductor devices make a good use of the high speed controllability of the bipolar transistor and the low power consumption of the MOS transistor and are widely used for gate arrays, memories, microprocessors and the like devices.

The transistors provided in the BiCMOS semiconductor devices are further subminiaturized in recent years following advancement of large size LSI and high speed controllability thereof. MOS transistors which are subminiaturized by a proportional reduction rule, when formed by highly doping an impurity in the substrate for high speed controllability, incur increase of capacitance between source and substrate or drain and substrate, so that it is difficult to realize a proper high density of impurity in the substrate corresponding to advancement of the subminiaturization. In this regard, n-channel MOS transistors may be reduced in gate lengths to 1 μm, but their source/drain dielectric strength is likely to be deteriorated to incur punchthrough. Hence, it has been proposed that a channel is first constituted under gate and p-type impurity ion of high energy is then implanted in the channel to obtain in appearance the same effect as an increase of density of impurity in a substrate.

Bipolar transistors, in particular, npn transistors need to make smaller the depth of an emitter and a base in order to improve the high speed controllability. The emitter is formed by ion implantation through a polysilicon layer, thereby reducing diffusion length. Also, an impurity highly doped n-type region is preliminarily provided below the base so as to decrease a substantial width thereof.

The aforesaid ion implantation may improve efficiency of MOS transistors to some extent but not sufficiently. Such an attempt has been reported that an epitaxial layer of n-type conductivity is formed on a substrate of p-type conductivity, in which epitaxial layer provided are n-type and p-type regions of high density wherein the aforesaid various types of MOS transistors or bipolar transistors are formed.

However, when the density of impurity in the n-type and p-type regions are set too high, capacitance between source and substrate or drain and substrate increases, thereby not improving substantial efficiency of MOS transistors.

Also, the bipolar transistors have a limit in improvement of the high speed controllability through reduction of diffusion length and the base width, similarly in the cases of npn transistors as well as the so-called vertical pnp transistors.

SUMMARY OF THE INVENTION

The present invention has been designed under the above circumstances. An object of the present invention is to provide a process of effectively preparing a large scale BiCMOS semiconductor device having an excellent dielectric strength and high speed controllability.

According to the present invention, it provides a process for preparing a BiCMOS semiconductor device having a MOS transistor element and a bipolar transistor element both of which are constituted in an epitaxial layer of n-type conductivity formed on a substrate of p-type conductivity, which comprises applying, after the formation of said epitaxial layer, an impurity ion of high energy simultaneously to specific areas of said MOS transistor element and an emitter region of said bipolar transistor element are to be formed, thereby forming highly doped impurity regions around the bottom of said channel region and around the bottom of a base region of said bipolar transistor element.

Since the method of the present invention applies an impurity ion to the channel region of MOS transistor in the epitaxial layer and simultaneously downward of the emitter region of the bipolar transistor, it can improve not only dielectric strength of the MOS transistor but also high speed controllability of the bipolar transistor by one effort.

DETAILED DESCRIPTION OF THE PREFERRED EMBODIMENTS

Figure 1:
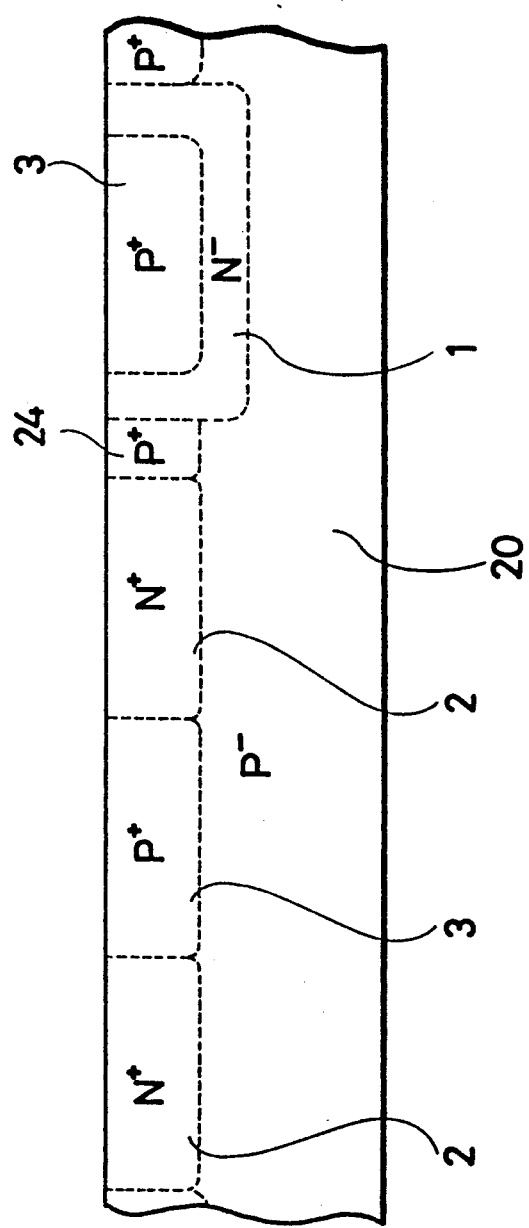
FIG. 1 is a schematic diagram showing a first step of an embodiment illustration of the preparing process of a BiCMOS semiconductor device of the present invention.

A substrate of p-type conductivity used in the present invention may be a known substrate made of silicon and the like. An epitaxial layer of n-type conductivity to be formed on the substrate may be provided by CVD process, MBE process, ALE process or the like.

For formation of a MOS transistor element and a bipolar transistor element in the n-type epitaxial layer, specific regions (wells) for defining sections where these elements are to be formed are first developed. Constitution of p-channel MOS transistor and npn transistor requires n-type regions, and n-channel MOS transistor and npn transistor requires p-type regions. The n-type region is provided by implanting an impurity of n-type conductivity, such as P, As or the like, in a predetermined region of $10^{16}$ to $10^{17}$ atom/cm$^3$. Also, the p-type region is provided by implanting an impurity of p-type conductivity, such as B or the like, in a predetermined region of $10^{16}$ to $10^{17}$ atom/cm$^3$.

The MOS transistor element and the bipolar transistor element are to be formed in the above n-type (or p-type) region by use of known techniques. For example, a p-channel MOS transistor may be obtained by forming a drain/source region defining a channel in the n-type region. A npn transistor may be achieved by forming in the n-type region a base composed of an impurity region of p-type conductivity followed by forming an emitter composed of n-type impurity region in the p-type impurity region. For an electrical connection with the substrate, specific conductive impurities highly doped regions may be provided corresponding to the n-type or p-type region. Also, a deeply embedded layer of n-type conductivity is formed to constitute a vertical pnp transistor serving as a pnp transistor.

The most characteristic point of the present invention is that in constitution of the MOS transistor and the bipolar transistor, their channel region and the emitter region are simultaneously applied with an impurity ion of high energy to form impurity highly doped layers, which are higher is impurity content than the p-type or n-type regions, near the bottom of the channel region and near the bottom of a base region beneath the emitter region. "Simultaneous" herein referred to means only one time of application of the impurity ion for both of the p-channel MOS transistor and the npn transistor. In case of parallel formation of p-channel MOS-npn transistor and n-channel MOS-pnp transistor, one application of the impurity ion for each combination of transistors (two times of application in all) is required. In detail, an impurity ion of n-type conductivity is applied for the combination of p-channel MOS-npn transistors and simultaneously an impurity of p-type conductivity for that of n-channel MOS-npn transistors. The application of the impurities ion may be conducted before or after formation of a source/drain region of the MOS transistors or an emitter/base region of the bipolar transistor (i.e., before formation of electrodes).

Applied energy of the impurities ion are to be set to deposit an impurity highly doped layer having p-type or n-type impurity of $10^{17}$ to $10^{19}$ atom/cm$^3$ and a suitable thickness near the bottom of the channel region and the base region after annealing.

After formation of the MOS transistor element and the bipolar transistor element having the impurity ion highly doped layers, various electrodes (source/drain/-gate electrodes, emitter/base/collector electrodes) and wiring are provided to obtain the predetermined BiCMOS semiconductor device, wherein the impurity highly doped layer which is higher in impurity content than the n-type or p-type region are formed near the bottom of the channel region of the MOS transistor and near the bottom of the base region of the bipolar transistor, ensuring dielectric strength of the MOS transistor and allowing the same to have high speed controllability, and also enabling high speed controllability of the bipolar transistor.

According to the present invention, the impurity highly doped layer can be obtained with an excellent reproducibility irrespective subminiaturization of the devices. Also, the impurity highly doped layer is deposited by the simultaneous application, resulting in a simple operation in production.

EXAMPLES

FIGS. 1 through 5 show a process in an example of the process for preparing a BiCMOS semiconductor device of the present invention.

A n-type embedded layer 1 was, first, formed in a pnp transistor region of a Si substrate 20 of p-type (100) conductivity. Then, n+embedded layers 2, 2 were formed in a p-channel MOS transistor region and npn transistor region and p+embedded layer 3 in a pnp transistor region followed by simultaneous formation of p+embedded layer 3 in n-channel MOS transistor region and an isolating p+embedded layer 24, as shown in FIG. 1.

Figure 2:
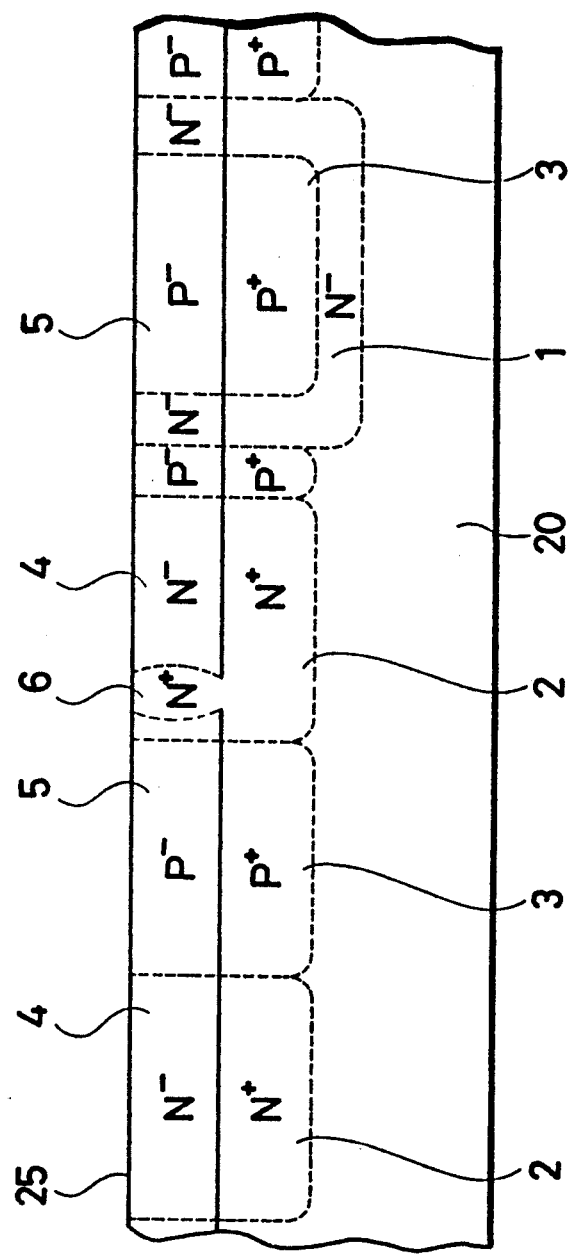
FIG. 2 is a schematic diagram showing a second step of the same embodiment as in FIG. 1 of the preparing process of the present invention.

Next, as shown in FIG. 2, a silicon epitaxial layer 25 was deposited on the Si substrate by CVD process followed by implantation of an impurity ion of p-type and n-type conductivity (boron and phosphorus herein used) to form n-type regions 4, 4 in the p-channel MOS transistor region and the npn transistor region and p-type regions 5, 5 in the n-channel MOS transistor region and the pnp transistor region. Reference numeral 6 denotes a collector connection layer. In this example, density of the n-type impurity in the n-type regions 4, 4 was about 3 to 5 $\times 10^{16}$ atom/cm$^3$ and that of p-type impurity in the p-type regions 5, 5 about 3 to 5$\times 10^{16}$ atom/cm$^3$, each lower than the embedded layers in the substrate.

Figure 3:
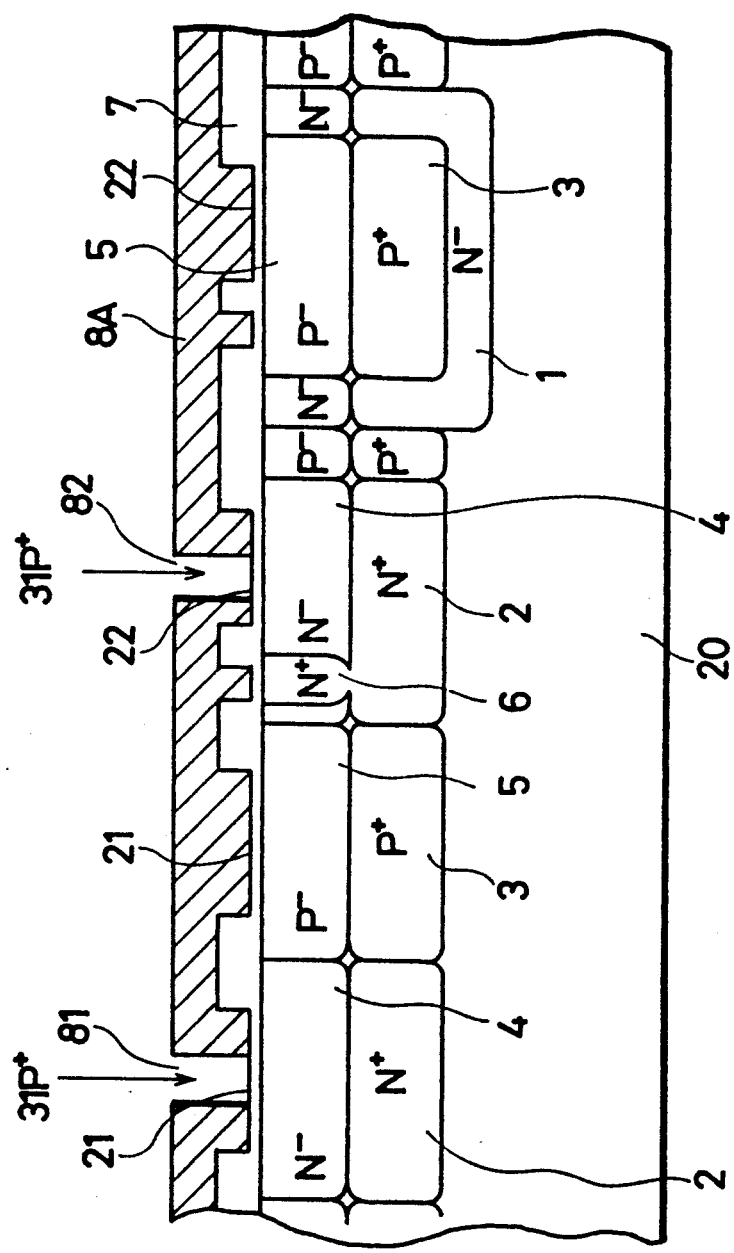
FIG. 3 is a schematic diagram showing a third step of the same embodiment as in FIG. 1.

Further, oxide layers 7 serving as gate oxide film and interlayer dielectric were formed as shown in FIG. 3 by thermal oxidation process and LOCOS process corresponding to intended devices. Thickness of a portion 21 of gate oxide film and oxide film 22 on the bipolar active region was about 200 Å in the example.

Figure 4:
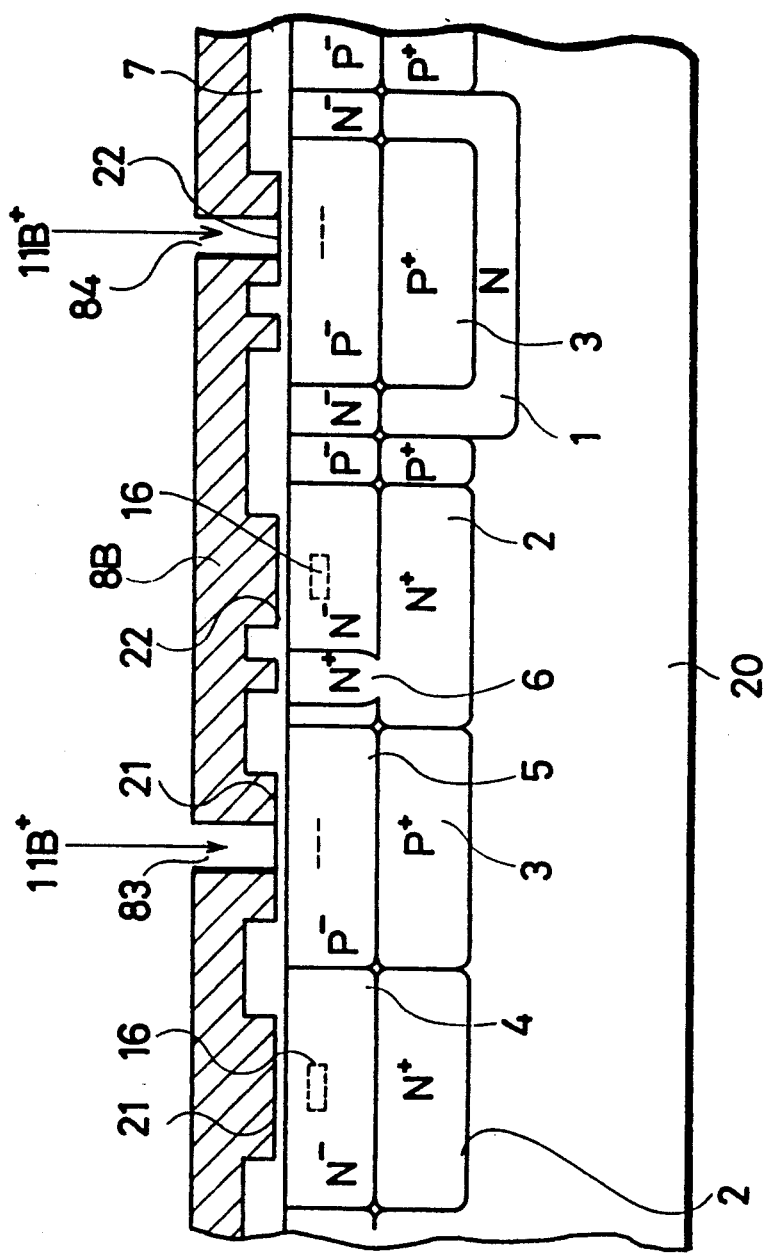
FIG. 4 is a schematic diagram showing a fourth step of the same embodiment as in FIG. 1 of the preparing process of the present invention.

A resist 8A was spin-coated on the surface of the epitaxial layer having the oxide layer 7, on which formed by photolithography a gate in the p-channel MOS transistor region and opening patterns 81, 82 in an emitter region of the npn transistor element, followed by simultaneous application of n-type impurity ion of high energy to both of the gate and the opening patterns by using the resist 8A as a mask. For the simultaneous application in this example was used 31p+ion of about 200 KeV by an ion implanter, so that n-type impurity ion was implanted below the channel region of the p-channel MOS transistor and below the emitter region of the npn transistor (the bottom of the base region) to form n-type impurity highly doped layers 16, 16, which are higher in impurity content than the n-type region, near the bottom of the channel region and near the bottom of the base region below the emitter region as shown in FIG. 4.

After removal of the resist 8A, a resist 8B was spin-coated, on which formed a gate in the n-channel MOS transistor region and opening patterns 83, 84 in the emitter region of the pnp transistor, followed by simultaneous application of p-type impurity ion of high energy to both of the gate and the opening patterns. For the simultaneous application in the example was used 11$_B$+ion of about 150 KeV, so that p-type impurity highly doped layers 17, 17 higher in impurity content than the n-type region were formed near the bottom of the channel region and near the bottom of the emitter region as shown in FIG. 5.

Figure 5:
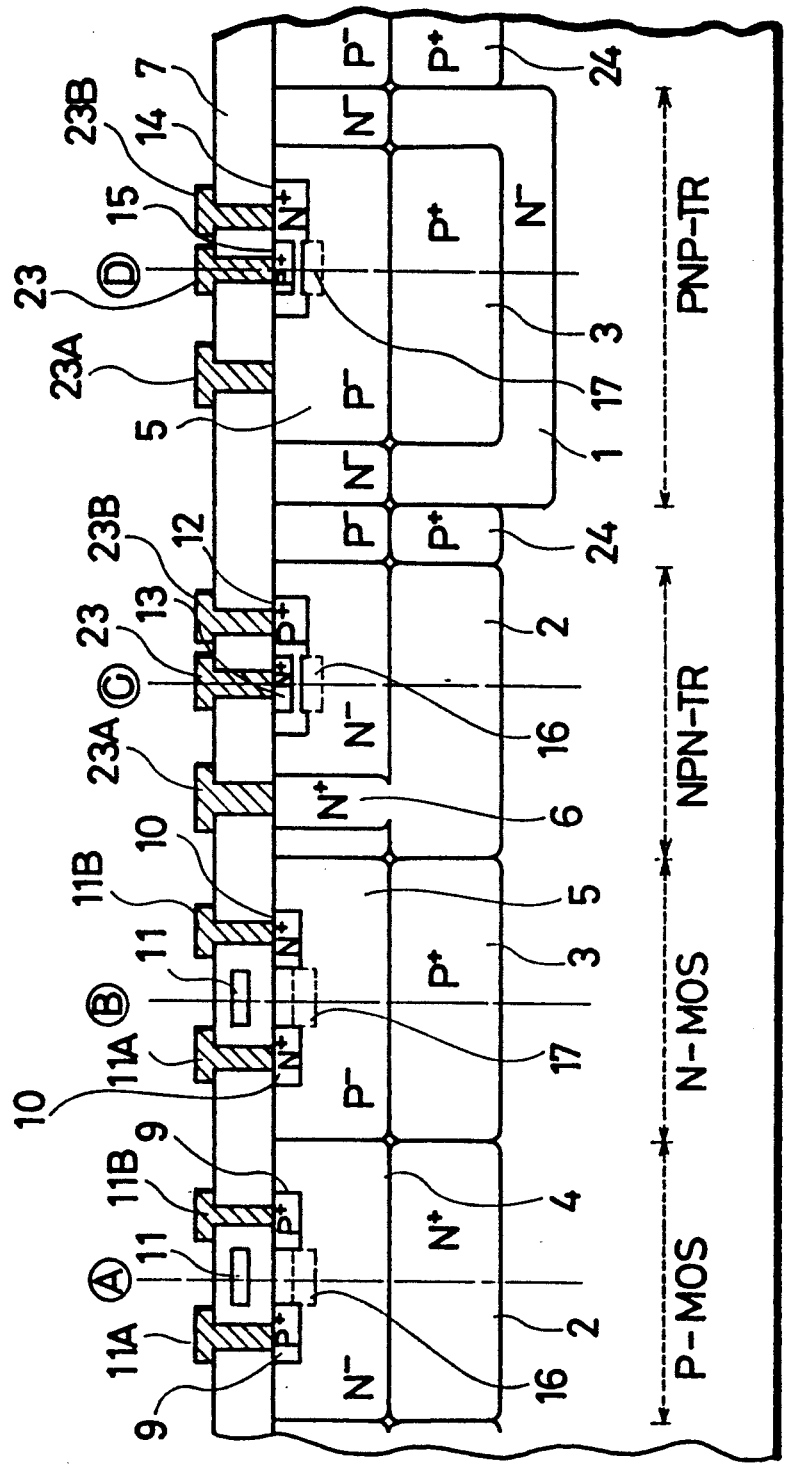
FIG. 5 is a schematic diagram showing a fifth step of the same embodiment as in FIG. 1.
Figure 6A:
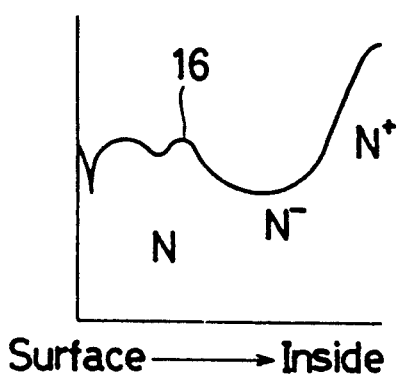
FIG. 6 are graphs showing profiles of density of impurity in the transistors after the simultaneous implantation of impurity ion.
Figure 6B:
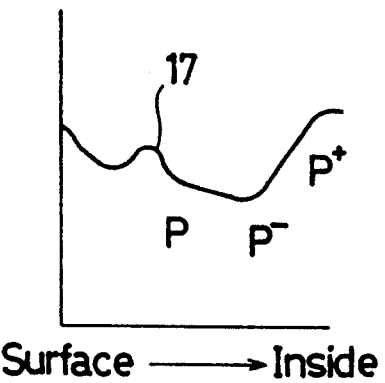
Figure 6C:
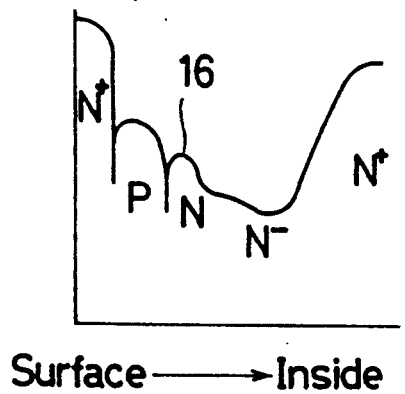
Figure 6D:
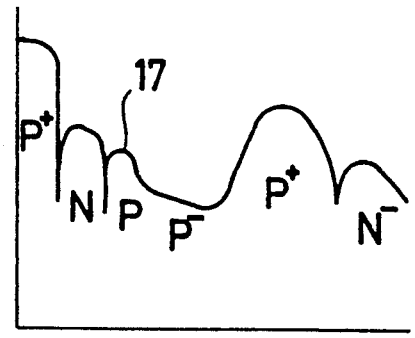

After the simultaneous implantation of the impurities, source and drain regions 9, 9 (or 10, 10), gate oxide film, gate electrodes 11 (of polysilicon), source wiring 11A and drain wiring 11B each for the MOS transistors, and emitter layers 13, 15, base layers 12, 14, emitter wiring 23 (of polysilicon), base wiring 23B and collector wiring 23A each for the bipolar transistors were formed to obtain a BiCMOS semiconductor device of the present invention as shown in FIG. 5.

Distribution of the impurities in their widthwise direction along the lines A, B, C and D in the resultant semiconductor device shown in FIG. 5 are graphed in FIG. 6. It will be appreciated that the impurity highly doped layers are formed near the bottom of the channel region of the MOS transistor and also near the bottom of the base region of the bipolar transistor.

The semiconductor device of the present invention does not exhibit punch-through, even when the MOS transistor element has 1 μm of gate length, thereby being quite excellent in dielectric strength in high speed controllability. Hence, according to the present invention, a BiCMOS semiconductor device superior in dielectric strength and high speed controllability can be simply prepared. Particularly, a BiCMOS semiconductor device having p/n channel MOS transistor element and npn/pnp bipolar transistor can be readily obtained with the above effect through two times of the simultaneous ion implantation.

What we claimed is:

1. A process for preparing a BiCOMOS semiconductor device having a MOS transistor element and a vertical type bipolar transistor element, said elements both being constituted in an epitaxial layer of n-type conductivity formed on a substrate of p-type conductivity, said process comprising the step of:
   (i) implanting n-type impurities at a high energy simultaneously around the bottom of a channel region of the p-channel MOS transistor and around the bottom of the base region of the NPN transistor.
   (ii) implanting p-type impurities at a high energy simultaneously around the bottom of a channel region of the n-channel MOS transistor and around the bottom of the base region of PNP-transistor, thereby forming a highly-doped impurity region having an impurity type opposite to the source-drain region around the bottom of said channel region of said MOS transistor element as well as a highly-doped impurity region having an impurity type opposite to the base region around the bottom of said base region of said bipolar transistor element.

2. A process of claim 1 in which a n-type impurity ion of high energy is applied through a first resist layer formed on the epitaxial layer and having openings corresponding to first specific areas of the epitaxial layer and subsequently a p-type impurity ion of high energy is applied through a second resist layer newly formed on the epitaxial layer after removal of the first resist layer and having openings corresponding to other specific areas than the first specific areas.

* * * * *